(12) United States Patent
Yang et al.

(10) Patent No.: US 11,187,740 B2
(45) Date of Patent: Nov. 30, 2021

(54) TIME DEPENDENT DIELECTRIC BREAKDOWN TEST STRUCTURE AND TEST METHOD THEREOF

(71) Applicant: Yangtze Memory Technologies Co., Ltd., Wuhan (CN)

(72) Inventors: Shengwei Yang, Wuhan (CN); Kun Han, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 171 days.

(21) Appl. No.: 16/207,178

(22) Filed: Dec. 2, 2018

(65) Prior Publication Data

US 2020/0141995 A1    May 7, 2020

Related U.S. Application Data

(63) Continuation of application No. PCT/CN2018/114143, filed on Nov. 6, 2018.

(51) Int. Cl.
*G01R 31/14* (2006.01)
*G01R 31/12* (2020.01)

(52) U.S. Cl.
CPC ............ *G01R 31/14* (2013.01); *G01R 31/129* (2013.01)

(58) Field of Classification Search
CPC ...... G01R 31/12; G01R 31/14; G01R 31/129; G01R 31/26; G01R 31/2858; H01L 22/34; H01L 22/14
See application file for complete search history.

(56) References Cited

U.S. PATENT DOCUMENTS

| 6,351,135 | B1 * | 2/2002 | Kim | .................... G01R 31/1227 324/548 |
| 6,489,783 | B1 * | 12/2002 | Liu | ....................... G01R 31/129 324/663 |
| 6,781,401 | B2 | 8/2004 | Kim | |
| 8,526,211 | B1 | 9/2013 | Zuniga | |
| 2001/0028056 | A1 * | 10/2001 | Yamamoto | .............. H01L 22/34 257/48 |

(Continued)

FOREIGN PATENT DOCUMENTS

| CN | 1387245 A | 12/2002 |
| CN | 1588102 A | 3/2005 |

(Continued)

OTHER PUBLICATIONS

Yu-Hui Huang et al., "Investigation of hot-carrier-injection assisted TDDB and multi-stage hot-hole induced leakage current in BCD HV NMOS", Apr. 6, 2017, <2017 IEEE International Reliability Physics Symposium (IRPS)>.

(Continued)

*Primary Examiner* — Son T Le
(74) *Attorney, Agent, or Firm* — Winston Hsu

(57) ABSTRACT

A time dependent dielectric breakdown test structure includes a plurality of test units connected in parallel between a constant voltage and a ground. Each of the plurality of test units includes a dielectric test sample connected to the constant voltage; and a current restraint unit connected between the dielectric test sample and the ground, for restraining a breakdown current from flowing on the dielectric test sample after the constant voltage has broken the dielectric test sample.

7 Claims, 5 Drawing Sheets

(56) References Cited

U.S. PATENT DOCUMENTS

| | | | |
|---|---|---|---|
| 2002/0033710 A1 | 3/2002 | Kim | |
| 2007/0069291 A1* | 3/2007 | Stuber | H01L 29/78615 257/347 |
| 2010/0060292 A1 | 3/2010 | De Vries | |
| 2013/0038334 A1* | 2/2013 | Brochu, Jr. | G01R 31/2858 324/537 |
| 2017/0336467 A1* | 11/2017 | Mikalo | H01L 23/528 |

FOREIGN PATENT DOCUMENTS

| | | | |
|---|---|---|---|
| CN | 101692449 A | 4/2010 |
| CN | 101702005 A | 5/2010 |
| CN | 102456750 A | 5/2012 |
| CN | 103918069 A | 7/2014 |
| CN | 104049666 A | 9/2014 |
| CN | 104345253 A | 2/2015 |
| CN | 204241624 U | 4/2015 |
| CN | 106291276 A | 1/2017 |
| CN | 106409817 A | 2/2017 |
| CN | 107393843 A | 11/2017 |
| CN | 206848417 U | 1/2018 |
| EP | 1 087 441 A2 | 3/2001 |
| JP | H09213760 A | 8/1997 |
| JP | 2001127126 A | 5/2001 |
| JP | 2001229671 A | 8/2001 |
| TW | 265482 | 12/1995 |
| TW | 460701 | 10/2001 |

OTHER PUBLICATIONS

Liu Hong-Xia, et al., "Experimental analysis and physical model investigation of TDDB of thin gate oxide", Jun. 12, 2001, <Acta Physica Sinica> vol. 50 No. 6, pp. 1172-1177.

* cited by examiner

TIME DEPENDENT DIELECTRIC BREAKDOWN TEST STRUCTURE AND TEST METHOD THEREOF

CROSS REFERENCE TO RELATED APPLICATIONS

This is a continuation application of International Application No. PCT/CN2018/114143 filed on Nov. 6, 2018, which are incorporated herein by reference in its entirety.

BACKGROUND OF THE INVENTION

1. Field of the Invention

The present invention relates to a time dependent dielectric breakdown test structure and test method thereof, and more particularly, to a time dependent dielectric breakdown test structure and test method thereof with current restraint unit.

2. Description of the Prior Art

In integrated circuit manufacturing, reliability assessment is an important part of process development. TDDB (Time Dependent Dielectric Breakdown) test is an important method to evaluate the reliability of dielectric materials, e.g., gate oxide of semiconducting transistor. However, TDDB test takes a long time for one-by-one test. In general, in order to ensure that the test results have certain statistical significance, a TDDB test condition requires a minimum sample size, e.g., at least 15 test samples. For some process with larger variations, the required sample size may be increased to ensure the confidence of the test results. However, increasing the sample size will significantly increase the test cycle.

Accordingly, it is desirable to provide a TDDB test structure and method thereof to effectively reduce test time.

SUMMARY OF THE INVENTION

It is therefore an objective of the present invention to provide a time dependent dielectric breakdown test structure and test method thereof, to perform batch test among a plurality of dielectric test samples to save test time.

To achieve the above technical object, according to the present invention, a TDDB test structure is provided, and includes a plurality of test units connected in parallel between a constant voltage and a ground. Each of the plurality of test units includes a dielectric test sample connected to the constant voltage, and a current restraint unit connected between the dielectric test sample and the ground, for restraining a breakdown current from flowing on the dielectric test sample after the breakdown of dielectric test sample.

Preferably, when the constant voltage is positive, the plurality of test units is a plurality of N-type test units, and the current restraint unit includes at least one DEPFET (depleted field effect) transistor comprising a drain connected to the dielectric test sample, a gate connected to the ground, a base connected to the ground, and a source; and a resistor connected between the source of the at least one DEPFET transistor and the ground; wherein a cross voltage of the resistor caused by the breakdown current is greater than an absolute of a total threshold voltage of the at least one DEPFET transistor.

Preferably, when the constant voltage is negative, the plurality of test units is a plurality of P-type test units, and the current restraint unit includes a resistor connected to the dielectric test sample; and at least one DEPFET transistor comprising a drain connected to the ground, a source connected to the resistor, a gate connected to the dielectric test sample, and a base connected to the dielectric test sample; wherein a cross voltage of the resistor caused by the breakdown current is greater than an absolute of a total threshold voltage of the at least one DEPFET transistor.

To achieve the above technical object, according to the present invention, there is provided a TDDB test method, includes connecting a plurality of test units in parallel between a constant voltage and a ground, and measuring a current-time curve between the constant voltage and the ground to read a plurality of breakdown times corresponding to the plurality of test units.

Preferably, the plurality of test units comprises a plurality of dielectric test samples, and the method further includes restraining one of a plurality of breakdown currents from flowing on one of the plurality of dielectric test samples after the constant voltage has broken the one of the plurality of dielectric test samples.

Preferably, each of the plurality of test units includes at least one DEPFET (depleted field effect) transistor with negative threshold voltage, the at least one DEPFET transistor is turned off after the constant voltage has broken one of the plurality of dielectric test samples, to restrain the breakdown current from flowing on one of the plurality of dielectric test samples. The DEPFET is turned on before the breakdown of dielectric test sample.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
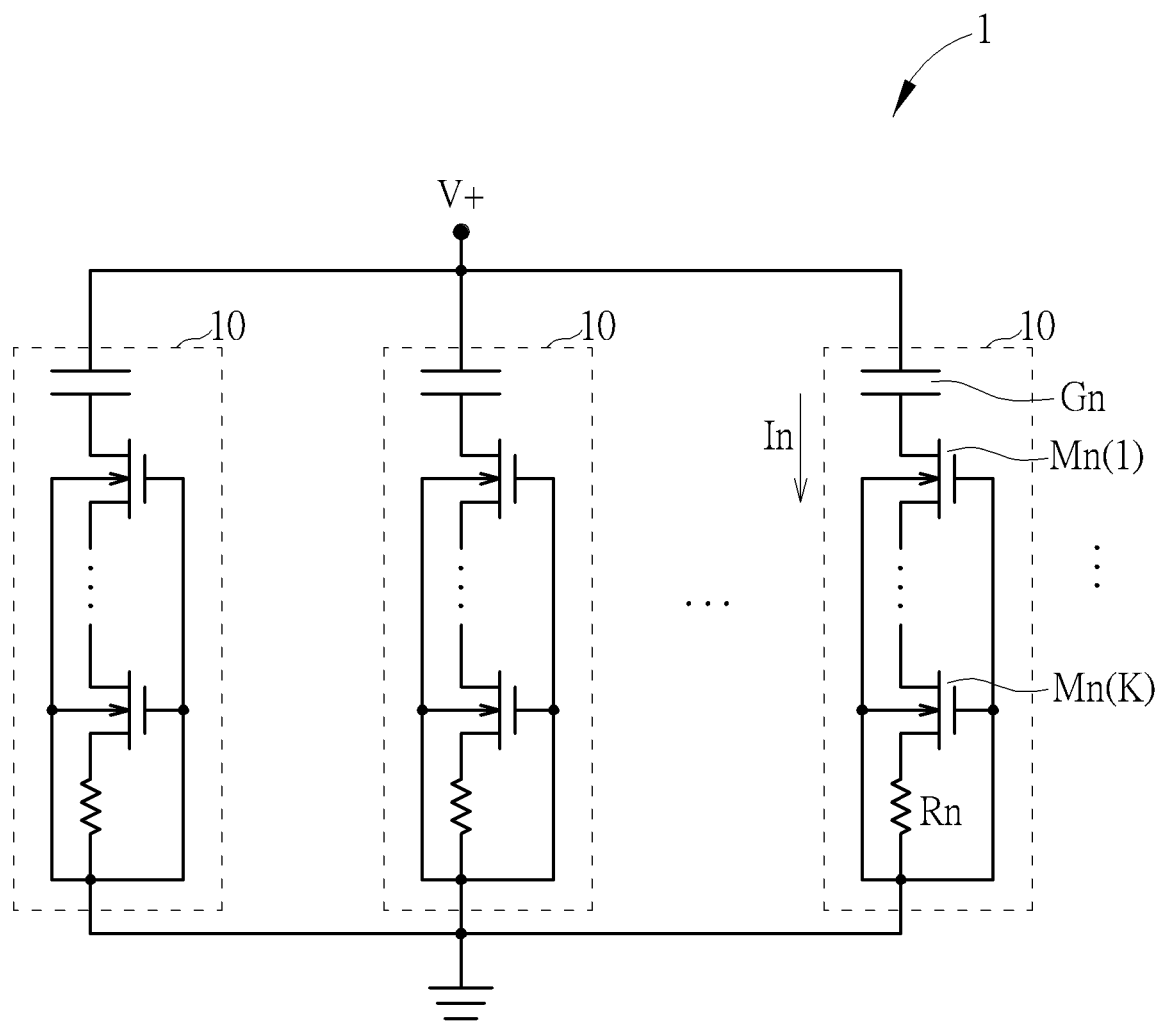
FIG. 1 is a schematic diagram of an N-type TDDB test structure according to an embodiment of the present invention.

FIG. 1 is a schematic diagram of an N-type TDDB (Time Dependent Dielectric Breakdown) test structure 1 according to an embodiment of the present invention. The N-type TDDB test structure 1 includes a plurality of N-type test units 10 connected in parallel between a constant positive voltage V+ and a ground.

Each of the plurality of test units 10 is structurally identical and includes a dielectric test sample Gn and a current restraint unit. The dielectric test sample Gn is connected between the constant positive voltage V+ and the current restraint unit. The current restraint unit includes at least one DEPFET (depleted field effect) transistor and a resistor Rn.

Given that the current restraint unit includes a plurality of DEPFET transistors Mn(1)~Mn(K) serially connected with each other between the dielectric test sample Gn and the resistor Rn. The plurality of DEPFET transistors Mn(1)~Mn(K) corresponds to a plurality of negative threshold voltages Vtn(1)~Vtn(K), respectively. The multi units for current restraint are employed to stand the constant positive voltage V+ if it is larger than drain to source breakdown voltage of single DEPFET transistor.

The threshold voltage Vtn(n) of each DEPFET transistor and the resistance Rn need to cooperate with each other to achieve the current restraint function of such unit. For example, a dielectric test sample resistance Rdi should be much larger than the resistance of the resistor Rn, Vtn(1)=Vtn(2)=Vtn(3)= . . . =Vtn(K), and the absolute value of negative threshold voltage Vtn(K) is smaller than In*Rn, where In is the breakdown current of according dielectric test sample. Before dielectric test sample breakdown, the limited resistance Rn is much smaller than dielectric test sample resistance, and will not impact the normal TDDB stress for samples. And due to the negative threshold of DEPFET transistors, they will keep opening while only little current goes through the current restraint units. Once the dielectric test sample is breakdown with a large current rising in the current restraint unit. The cross voltage of the resistor Rn is raised to be larger than the absolute value of negative threshold voltage Vtn(K), and it makes all DEPFET transistors turned off to restrain current in such unit. Also it can keep other un-breakdown dielectric test sample normally stressed under the constant positive voltage V+.

Figure 2:
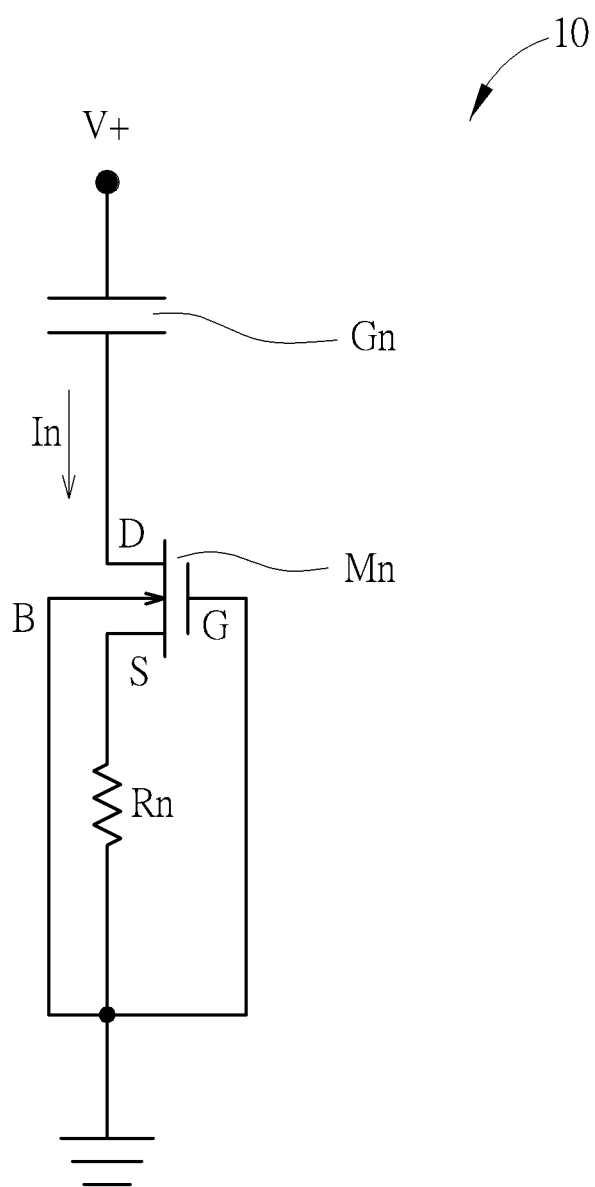
FIG. 2 is a schematic diagram of a test unit of the N-type TDDB test structure of FIG. 1 according to an embodiment of the present invention.

FIG. 2 is a schematic diagram of the N-type test unit 10 according to an embodiment of the present invention. Given that the N-type test unit 10 includes one DEPFET transistor Mn for example.

The DEPFET transistor Mn includes a drain D connected to the dielectric test sample Gn, a source S connected to the resistor Rn, a gate G connected to the ground, and a base B connected to the ground. The resistor Rn is connected between the source of the DEPFET transistor Mn and the ground.

Given that a threshold voltage Vtn of the DEPFET transistor Mn is −0.5V (Volts), which means that the DEPFET transistor Mn is turned on when a gate-to-source voltage Vgs of the DEPFET transistor Mn is greater than −0.5V, and the DEPFET transistor Mn is turned off when the gate-to-source voltage Vgs is less than −0.5V. Given that a resistance of the resistor Rn is 50 ohm, the breakdown current In is 20 mA.

Before the positive voltage V+ breaks the dielectric test sample Gn, a current flowing on the dielectric test sample Gn is small enough to be neglected, and also the cross voltage of the resistor Rn is small enough to be neglected. The gate-to-source voltage Vgs=0V is greater than the threshold voltage Vtn=−0.5V, and the DEPFET transistor Mn is turned on.

When the positive voltage V+ breaks the dielectric test sample Gn to generate the breakdown current In=20 mA, the cross voltage of the resistor Rn becomes 20 mA*50 ohm=1V, and the gate-to-source voltage Vgs becomes −1V to be less than the threshold voltage Vtn=−0.5V. Therefore, the DEPFET transistor Mn is turned off ever since the positive voltage V+ has broken the dielectric test sample Gn.

As a result, referring to the embodiment of FIG. 1, ever since the positive voltage V+ has broken any one of the plurality of N-type test units 10, the plurality of DEPFET transistors Mn(1)~Mn(K) may be turned off to restrain the breakdown current In from flowing on the dielectric test sample Gn. Therefore, the N-type TDDB test structure 1 of the present invention can perform batch test among the plurality of N-type test units 10, which saves time than one-by-one test in the prior art.

Figure 3:
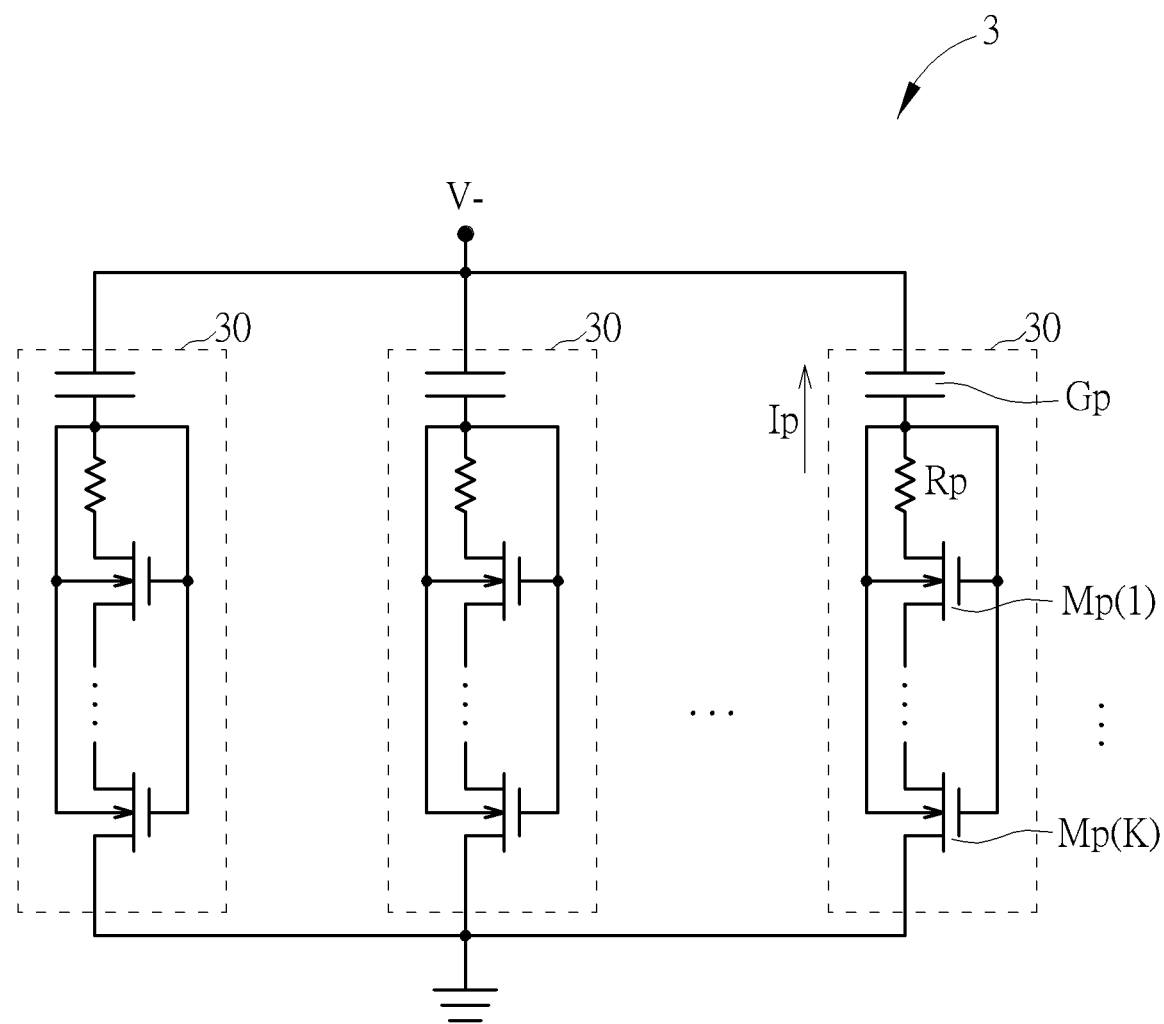
FIG. 3 is a schematic diagram of a P-type TDDB test structure according to an embodiment of the present invention.

FIG. 3 is a schematic diagram of a P-type TDDB test structure 3 according to an embodiment of the present invention. The P-type TDDB test structure 3 includes a plurality of P-type test units 30 connected in parallel between a constant negative voltage V− and a ground.

Each of the plurality of test units 30 is structurally identical and includes a dielectric test sample Gp and a current restraint unit. The dielectric test sample Gp is connected between the constant negative voltage V− and the current restraint unit. The current restraint unit includes at least one DEPFET (depleted field effect) transistor and a resistor Rp.

Given that the current restraint unit includes a plurality of DEPFET transistors Mp(1)~Mp(K) serially connected with each other between the dielectric test sample Gp and the resistor Rp. The plurality of DEPFET transistors Mp(1)~Mp(K) corresponds to a plurality of negative threshold voltages Vtp(1)~Vtp (K), respectively. The multi units for current restraint are employed to stand the constant negative voltage V− if it is larger than drain to source breakdown voltage of single DEPFET transistor.

The threshold voltage Vtp(n) of each DEPFET transistor and the resistance Rp need to cooperate with each other to achieve the current restraint function of such unit. For example, a dielectric test sample resistance Rdi should be much larger than the resistance of the resistor Rp, Vtp(1)=Vtp(2)=Vtp(3)= . . . =Vtp (K), and the absolute value of negative threshold voltage Vtp(K) is smaller than Ip*Rp, where Ip is the breakdown current of according dielectric test sample. Before dielectric test sample breakdown, the limited resistance Rp is much smaller than dielectric test sample resistance, and will not impact the normal TDDB stress for samples. And due to the negative threshold of DEPFET transistors, they will keep opening while only little current goes through the current restraint units. Once the dielectric test sample is breakdown with a large current rising in the current restraint unit. The cross voltage of the resistor Rp is raised to be larger than the absolute value of negative threshold voltage Vtp(K), and it makes all DEPFET transistors turned off to restrain current in such unit. Also it can keep other un-breakdown dielectric test sample normally stressed under the constant negative voltage V−.

Figure 4:
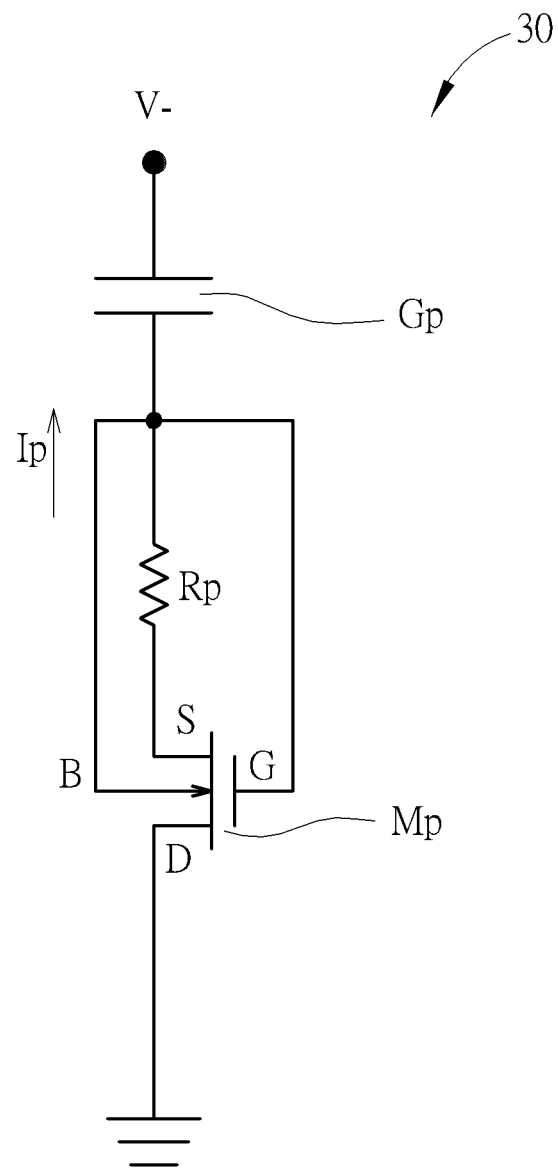
FIG. 4 is a schematic diagram of a test unit of the P-type TDDB test structure of FIG. 3 according to an embodiment of the present invention.

FIG. 4 is a schematic diagram of the N-type test unit 30 according to an embodiment of the present invention. Given that the P-type test unit 30 includes one DEPFET transistor Mp for example.

The DEPFET transistor Mp includes a drain D connected to the dielectric test sample Gp, a source S connected to the resistor Rp, a gate G connected to the ground, and a base B connected to the ground. The resistor Rp is connected between the source of the DEPFET transistor Mp and the ground.

Given that a threshold voltage Vtp of the DEPFET transistor Mp is −0.5V, which means that the DEPFET transistor Mp is turned on when a gate-to-source voltage Vgs of the DEPFET transistor Mp is greater than −0.5V, and the DEPFET transistor Mp is turned off when the gate-to-source voltage Vgs is less than −0.5V. Given that a resistance of the resistor Rp is 50 ohm, the breakdown current Ip is 20 mA.

Before the negative voltage V− breaks the dielectric test sample Gp, a current flowing on the dielectric test sample Gp is small enough to be neglected, and also the cross voltage of the resistor Rp is small enough to be neglected. The gate-to-source voltage Vgs=0V is greater than the threshold voltage Vtp=−0.5V, and the DEPFET transistor Mp is turned on.

When the negative voltage V− breaks the dielectric test sample Gp to generate the breakdown current Ip=20 mA, the cross voltage of the resistor Rp becomes 20 mA*50 ohm=1V, and the gate-to-source voltage Vgs becomes −1V to be less than the threshold voltage Vtp=−0.5V. Therefore, the DEPFET transistor Mp is turned off ever since the negative voltage V− has broken the dielectric test sample Gp.

As a result, referring to the embodiment of FIG. 3, ever since the negative voltage V− has broken any one of the plurality of P-type test units 30, the plurality of DEPFET transistors Mp(1)~Mp(K) may be turned off to restrain the breakdown current Ip from flowing on the dielectric test sample Gp. Therefore, the P-type TDDB test structure 3 of the present invention can perform batch test among the plurality of P-type test units 30, which saves time than one-by-one test in the prior art.

Figure 5:
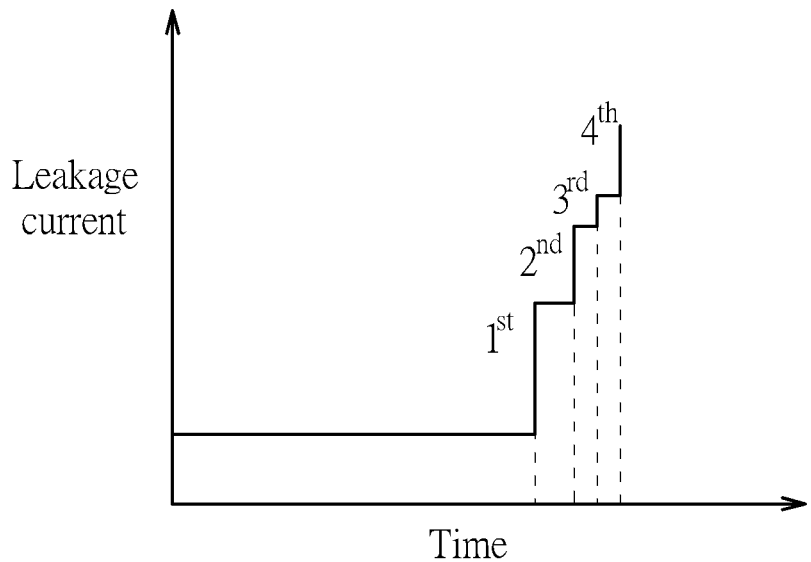
FIG. 5 is a current-time curve of a TDDB test structure according to an embodiment of the present invention.

FIG. 5 is a current-time curve of a TDDB test structure according to an embodiment of the present invention. As observed from FIG. 5, when a constant voltage breaks a first dielectric test sample, a breakdown current is generated to cause a first current jump at a first time point, and a current restraint unit corresponding to the first dielectric test sample restrains the breakdown current within a first current level until the constant voltage breaks a second dielectric test sample.

Note that when the first dielectric test sample is broken, the corresponding current restraint unit turns off a current route for the breakdown current. Therefore, a total resistance of the TDDB test structure is decreased and a total leakage current of the TDDB test structure is increased under the constant voltage.

By reading a plurality of current jumps corresponding to a plurality of time points, a plurality of life times for the dielectric test samples may be obtained.

Figure 6:
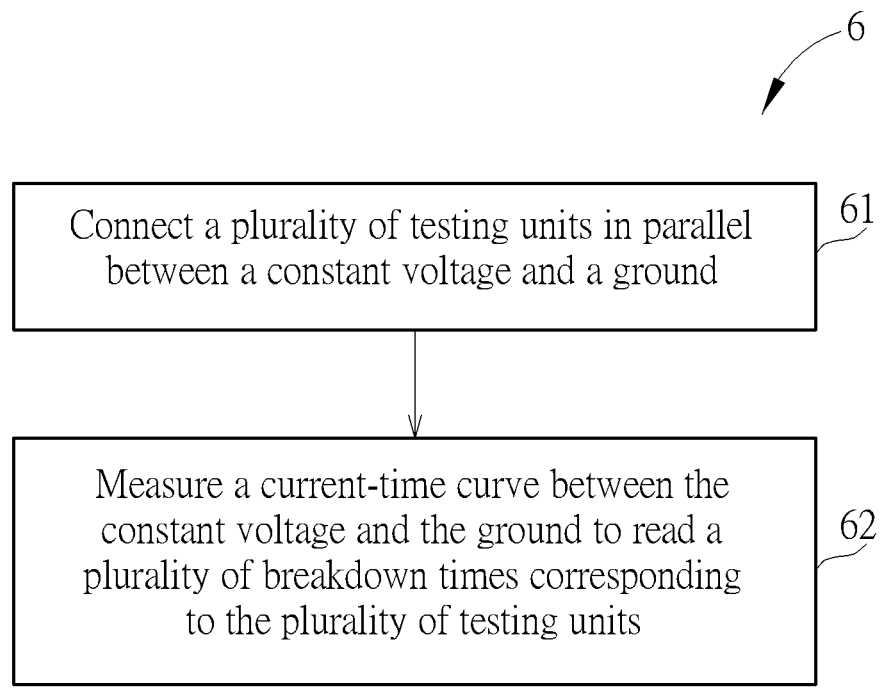
FIG. 6 is a flowchart of a TDDB test process according to an embodiment of the present invention.

FIG. 6 is a flowchart of a TDDB test process 6 according to an embodiment of the present invention. The TDDB test process 6 includes the following step.

Step 61: Connect a plurality of testing units in parallel between a constant voltage and a ground.

Step 62: Measure a current-time curve between the constant voltage and the ground to read a plurality of breakdown times corresponding to the plurality of testing units.

Detailed operations of the TDDB test process 6 may be obtained by referring to descriptions regarding FIG. 1 to FIG. 5, which is omitted.

To sum up, the present invention provides the N-type and P-type TDDB test structures to perform batch test among a plurality of N-type and P-type test units, which saves time than one-by-one test in the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A time dependent dielectric breakdown (TDDB) test structure, comprising:
   a plurality of N-type test units connected in parallel between a constant voltage and a ground, wherein the constant voltage is positive and each of the plurality of N-type test units comprises:
      a dielectric test sample connected to the constant voltage;
      a current restraint circuit, comprising:
         at least one depleted field effect (DEPFET) transistor comprising a drain connected to the dielectric test sample, a gate connected to the ground, a base connected to the ground, and a source, configured to restrain a breakdown current from flowing on the dielectric test sample after the constant voltage has broken the dielectric test sample; and
         a resistor connected between the source of the at least one DEPFET transistor and the ground;
   wherein the dielectric test sample is still directly connected to the constant voltage after the constant voltage has broken the dielectric test sample;
   wherein a cross voltage of the resistor caused by the breakdown current is greater than an absolute of a total threshold voltage of the at least one DEPFET transistor.

2. The TDDB test structure of claim 1, wherein when the constant voltage breaks the dielectric test sample, the cross voltage of the resistor causes a total gate-to-source voltage of the at least one DEPFET transistor less than the total threshold voltage to turn off the at least one DEPFET transistor, to restrain the breakdown current from flowing on the dielectric test sample.

3. A time dependent dielectric breakdown (TDDB) test structure, comprising:
   a plurality of P-type test units connected in parallel between a constant voltage and a ground, wherein the constant voltage is negative and each of the plurality of P-type test units comprises:
      a dielectric test sample connected to the constant voltage; and
      a current restraint circuit comprising:
         at least one depleted field effect (DEPFET) transistor comprising a drain connected to the ground, a source, a gate connected to the dielectric test sample, and a base connected to the dielectric test sample, configured to restrain a breakdown current from flowing on the dielectric test sample after the constant voltage has broken the dielectric test sample; and
         a resistor connected between the source of the at least one DEPFET transistor and the dielectric test sample;
   wherein the dielectric test sample is still directly connected to the constant voltage after the constant voltage has broken the dielectric test sample;
   wherein a cross voltage of the resistor caused by the breakdown current is greater than an absolute of a total threshold voltage of the at least one DEPFET transistor.

4. The TDDB test structure of claim 3, wherein when the constant voltage breaks the dielectric test sample, the cross voltage of the resistor causes a total gate-to-source voltage of the at least one DEPFET transistor less than the total threshold voltage to turn off the at least one DEPFET transistor, to restrain the breakdown current from flowing on the dielectric test sample.

5. A time dependent dielectric breakdown (TDDB) test method, comprising:
  connecting a plurality of test units in parallel between a constant voltage and a ground; and
  measuring a current-time curve between the constant voltage and the ground to read a plurality of breakdown times corresponding to the plurality of test units;
  wherein the plurality of test units comprises a plurality of dielectric test samples, and one of the plurality of dielectric test samples is still directly connected to the constant voltage after the constant voltage has broken the one of the plurality of dielectric test samples;
  wherein each of the plurality of test units comprises at least one depleted field effect (DEPFET) transistor;
  wherein the plurality of test units are a plurality of N-type test units or a plurality of P-type test units; and
  wherein the plurality of N-type test unit connected in parallel between a constant voltage and a ground, wherein the constant voltage is positive and each of the plurality of N-type test units comprises a dielectric test sample connected to the constant voltage;
    a current restraint circuit, comprising:
      at least one depleted field effect (DEPFET) transistor comprising a drain connected to the dielectric test sample, a gate connected to the ground, a base connected to the ground, and a source, configured to restrain a breakdown current from flowing on the dielectric test sample after the constant voltage has broken the dielectric test sample; and
      a resistor connected between the source of the at least one DEPFET transistor and the ground; and
  wherein the plurality of P-type test units are a plurality connected in parallel between a constant voltage and a ground, wherein the constant voltage is negative and each of the plurality of P-type test units comprises:
    a dielectric test sample connected to the constant voltage; and
    a current restraint circuit comprising:
      at least one depleted field effect (DEPFET) transistor comprising a drain connected to the ground, a source, a gate connected to the dielectric test sample, and a base connected to the dielectric test sample, configured to restrain a breakdown current from flowing on the dielectric test sample after the constant voltage has broken the dielectric test sample; and
      a resistor connected between the source of the at least one DEPFET transistor and the dielectric test sample.

6. The TDDB test method of claim 5, wherein the method further comprises:
  restraining one of a plurality of breakdown currents from flowing on one of the plurality of dielectric test samples after the constant voltage has broken the one of the plurality of dielectric test samples.

7. The TDDB test method of claim 6, the at least one DEPFET transistor is turned off after the constant voltage has broken one of the plurality of dielectric test samples, to restrain the breakdown current from flowing on one of the plurality of dielectric test samples.

* * * * *